United States Patent
Schneider et al.

(10) Patent No.: US 10,000,846 B2
(45) Date of Patent: Jun. 19, 2018

(54) METHOD FOR PRODUCING A TRIBOLOGICALLY DISTRESSED LAMINATE, A LAMINATE AND USE OF AN ORGANOMETALLIC COMPOUND FOR PRODUCING A FUNCTIONAL LAYER OF THE LAMINATE

(71) Applicant: Schaeffler Technologies GmbH & Co. KG, Herzogenaurach (DE)

(72) Inventors: Andreas Schneider, Bammersdorf (DE); Yashar Musayev, Nuremberg (DE); Tim Matthias Hosenfeldt, Nuremberg (DE)

(73) Assignee: Schaeffler Technologies GmbH & Co. KG., Herzogenaurach (DE)

( * ) Notice: Subject to any disclaimer, the term of this patent is extended or adjusted under 35 U.S.C. 154(b) by 706 days.

(21) Appl. No.: 14/410,550

(22) PCT Filed: May 23, 2013

(86) PCT No.: PCT/EP2013/060608
§ 371 (c)(1),
(2) Date: Dec. 22, 2014

(87) PCT Pub. No.: WO2014/000994
PCT Pub. Date: Jan. 3, 2014

(65) Prior Publication Data
US 2015/0337437 A1 Nov. 26, 2015

(30) Foreign Application Priority Data
Jun. 26, 2012 (DE) .................. 10 2012 210 796

(51) Int. Cl.
| | | |
|---|---|---|
| C23C 16/50 | (2006.01) | |
| C23C 16/452 | (2006.01) | |
| C23C 16/513 | (2006.01) | |
| C23C 16/02 | (2006.01) | |
| C23C 16/16 | (2006.01) | |
| C23C 16/18 | (2006.01) | |
| C23C 16/26 | (2006.01) | |
| C23C 28/00 | (2006.01) | |

(52) U.S. Cl.
CPC ........ C23C 16/452 (2013.01); C23C 16/0281 (2013.01); C23C 16/16 (2013.01); C23C 16/18 (2013.01); C23C 16/26 (2013.01); C23C 16/50 (2013.01); C23C 16/513 (2013.01); C23C 28/322 (2013.01); C23C 28/343 (2013.01); C23C 28/347 (2013.01); Y10T 428/12625 (2015.01)

(58) Field of Classification Search
USPC ...... 427/249.1, 249.7, 249.17, 577; 428/472, 428/408
See application file for complete search history.

(56) References Cited

U.S. PATENT DOCUMENTS

| | | | |
|---|---|---|---|
| 5,771,873 A | 6/1998 | Pottery et al. | |
| 6,491,978 B1 | 12/2002 | Kalyanam et al. | |
| 7,666,474 B2 * | 2/2010 | Li .......................... | C23C 16/32 427/249.1 |
| 2005/0019576 A1 * | 1/2005 | Dahl ...................... | B82Y 10/00 428/408 |
| 2007/0160761 A1 | 7/2007 | Reuter et al. | |
| 2008/0280067 A1 | 11/2008 | Shi-Kun et al. | |
| 2011/0101620 A1 * | 5/2011 | Hoppe ................ | C23C 16/0272 277/442 |
| 2011/0164842 A1 | 7/2011 | Hosenfeldt et al. | |
| 2013/0316156 A1 | 11/2013 | Kennedy et al. | |

FOREIGN PATENT DOCUMENTS

| | | |
|---|---|---|
| DE | 10 2010 062114 | 5/2012 |
| EP | 0 579 983 | 1/1994 |
| EP | 1 806 352 | 7/2007 |
| WO | WO 2010/026092 | 3/2010 |

OTHER PUBLICATIONS

Lai et al "Precursor for Organometallic Chemical Vapor Deposition of Tungsten Carbide Films" Chem. Mater. (1995) p. 2284-2292.*

* cited by examiner

Primary Examiner — Archene Turner
(74) Attorney, Agent, or Firm — Davidson, Davidson & Kappel, LLC

(57) ABSTRACT

A method for producing a laminate that has to undergo frictional loads, including a substrate and a functional layer formed from tungsten-containing, amorphous diamond-like carbon. To be able to produce such functional layers easily, they are applied by means of a tungsten-containing precursor and by using a PACVD process. A laminate including a functional layer produced by means of a precursor and to the use of a metallo-organic compound as a precursor for producing a functional layer.

12 Claims, No Drawings

METHOD FOR PRODUCING A TRIBOLOGICALLY DISTRESSED LAMINATE, A LAMINATE AND USE OF AN ORGANOMETALLIC COMPOUND FOR PRODUCING A FUNCTIONAL LAYER OF THE LAMINATE

The present invention relates to a method for producing a tribologically stressed laminate, which includes a substrate and a functional layer made of tungsten-containing, amorphous, diamond-like carbon, a laminate which includes a functional layer produced with the aid of a precursor and the use of an organometallic compound as the precursor for producing a functional layer.

BACKGROUND

Generic coating methods are known for achieving tribologically stressable and corrosion-resistant layers for machine components, such as antifriction bearing components, motor elements and tools. For example, coating methods are proposed in WO 2010/026092 A2 in the form of PVD (physical vapor deposition) or PACVD (plasma assisted chemical vapor deposition), with the aid of which thin and tribologically resistant coatings may be achieved. For example, single-layer or multi-layer coatings have become known under the brand name Triondur®, with which functional layers made of hydrogen-containing, amorphous carbon layers (a-C:H) and tungsten-doped, hydrogen-containing, amorphous carbon layers (a-C:H:W) may be produced. Targets made of tungsten or tungsten compounds such as tungsten carbide are used in this case. These compounds are procedurally complicated to process, the production layout is complex, due to the vacuum to be set with the aid of cost-intensive turbomolecular pumps, and the coating periods are long, due to slow coating rates.

SUMMARY OF THE INVENTION

It is an object of the present invention to further improve generic deposition methods, in particular to increase their productivity and operational safety. In addition, a correspondingly cost-effective laminate manufactured with a reduced production complexity is proposed. Finally, products should be used which may be applied in an improved way as known substances for producing laminates.

The present invention provides a method for producing a tribologically stressed laminate including a substrate and a functional layer made of tungsten-containing, amorphous, diamond-like carbon, the functional layer being applied with the aid of a tungsten-containing precursor, using a PACVD method. The functional layer is preferably provided as a tungsten-containing a-C:H layer. This layer may be a contact layer of the substrate to a tribological contact partner, such as a friction partner. In a multi-layer laminate, however, it has proven to be advantageous if the tungsten-containing functional layer produced with the aid of the precursor is provided as an intermediate layer, while the contact layer is completely provided as an a-DLC layer. In depositing the precursor onto the substrate, for example, an iron-containing material such as steel is advantageous, on whose surface an adhesion-promoting layer made of metal, such as chromium, titanium and the like or its compounds, is to be applied first, followed by the proposed functional layer.

According to the inventive idea, the precursor is present in its liquid phase, i.e., it is liquid at the working temperature of the deposition itself or is dissolved in a corresponding solvent. Due to the existing vapor pressure of the precursor at the predetermined working temperature, high deposition rates may be achieved during the proposed deposition process, using a preferably plasma-assisted chemical vapor deposition (PACVD) method. For this purpose, for example, the liquid or dissolved precursor is atomized and conducted by an inert gas flow via a plasma into the deposition chamber for the purpose of ionization, in which one or multiple workpieces to be coated are introduced. Due to charge differences, the ionized precursor/inert gas mixture is deposited onto the oppositely charged workpieces for the purpose of producing the laminate.

The laminates produced from the workpieces are preferably used as friction bearing components, motor elements, tools and the like and are, at least in the areas where a tribologically stressed contact exists to other components, provided with the proposed functional layer. The counter-surfaces coming into contact which this functional layer may be provided without coating, with the proposed functional layer or possibly with additional layers.

Due to the requirements of the precursor, it has proven to be particularly advantageous to provide the precursor from an organometallic substance. The organometallic substance contains a central atom of tungsten, at least one ligand of carbon monoxide and at least one ligand of an organic compound. Mononuclear or polynuclear complexes may be provided. It has turned out to be particularly suitable if the organic compound is an at least diunsaturated hydrocarbon, for example a diene. A precursor of $[(CO)_2(diene)_2W]$ has proven to be particularly advantageous, i.e., one which has two ligands of carbon monoxide and two ligands of diene, the diene being able to occur as a polydentate ligand, forming a chelate complex. The formation of the chelate complex takes place, for example, from a photochemical transformation of tungsten carbonyls with the aid of dienes. This transformation of wolfram carbonyls with dienes may take place in a corresponding way in suitable environments, such as chemical production facilities, laboratories, etc., so that only comparatively little toxic handling is carried out at the production site of the laminates. For example, safety-relevant products of the deposition may be captured in the vacuum chamber by adding reactive gases such as acetylene and the like to the vacuum chamber.

Another aspect of the object is achieved by a laminate having a metallic substrate, an intermediate layer applied thereto made of metal, such as chromium, titanium and the like, the proposed functional layer and a contact layer deposited thereon made of amorphous, diamond-like carbon.

Another aspect of the object is achieved by using a organometallic compound as the precursor for the purpose of producing a functional layer on a metal substrate with the aid of a PACVD method. Organometallic compounds having tungsten as the central atom and carbon monoxide as well as polyunsaturated hydrocarbons as ligands may be used.

The invention claimed is:

1. A method for producing a tribologically stressed laminate, comprising:
    applying a functional layer to a substrate, the functional layer made of tungsten-containing, amorphous, diamond-like carbon,
    wherein the functional layer is applied using a PACVD method and a tungsten-containing precursor.
2. The method as recited in claim 1 wherein the precursor is liquid or dissolved in liquid.
3. The method as recited in claim 2 wherein the precursor is made of an organometallic substance.

4. The method as recited in claim 3 wherein the organometallic substance includes a central atom of tungsten, at least one ligand of carbon monoxide and at least one ligand of an organic compound.

5. The method as recited in claim 4 wherein the organic compound is an at least diunsaturated hydrocarbon.

6. The method as recited in claim 3 wherein the precursor is a $[(CO)_2(diene)_2W]$ compound.

7. The method as recited in claim 2 wherein the precursor is applied to the substrate with the aid of vapor pressure.

8. A laminate comprising:
   a metal substrate, an intermediate layer made of chromium applied thereto, a functional layer applied with the aid of a tungsten-containing precursor, using a PACVD method and a further functional layer deposited thereon, made of amorphous, diamond-like carbon, the precursor including a central atom of tungsten, at least one ligand of carbon monoxide and at least one ligand of an organic compound.

9. The method as recited in claim 8 wherein the organic compound is an at least diunsaturated hydrocarbon.

10. The method as recited in claim 8 wherein the precursor is a $[(CO)_2(diene)_2W]$ compound.

11. A method comprising:
   providing an organometallic compound as a precursor and producing a functional layer on a metal substrate using a PACVD method and the precursor, the functional layer being a tungsten-containing a-C:H layer.

12. The method as recited in claim 11 wherein the organometallic compound has tungsten as the central atom and carbon monoxide as well as polyunsaturated hydrocarbons as ligands.

* * * * *

UNITED STATES PATENT AND TRADEMARK OFFICE
CERTIFICATE OF CORRECTION

| | | |
|---|---|---|
| PATENT NO. | : 10,000,846 B2 | Page 1 of 1 |
| APPLICATION NO. | : 14/410550 | |
| DATED | : June 19, 2018 | |
| INVENTOR(S) | : Andreas Schneider et al. | |

It is certified that error appears in the above-identified patent and that said Letters Patent is hereby corrected as shown below:

In the Claims

Please replace "method" with "laminate" in Claim 9, at Column 3, Line 20.

Please replace "method" with "laminate" in Claim 10, at Column 3, Line 22.

Signed and Sealed this
Eighteenth Day of September, 2018

Andrei Iancu
*Director of the United States Patent and Trademark Office*